(12) United States Patent
Godyak

(10) Patent No.: US 8,444,870 B2
(45) Date of Patent: May 21, 2013

(54) INDUCTIVE PLASMA SOURCE WITH HIGH COUPLING EFFICIENCY

(75) Inventor: Valery Godyak, Brookline, MA (US)

(73) Assignee: Mattson Technology, Inc., Fremont, CA (US)

( * ) Notice: Subject to any disclaimer, the term of this patent is extended or adjusted under 35 U.S.C. 154(b) by 247 days.

(21) Appl. No.: 12/471,375

(22) Filed: May 23, 2009

(65) Prior Publication Data

US 2010/0136262 A1    Jun. 3, 2010

Related U.S. Application Data

(62) Division of application No. 11/843,595, filed on Aug. 22, 2007.

(60) Provisional application No. 60/839,011, filed on Aug. 22, 2006.

(51) Int. Cl.
*H01J 37/3211* (2006.01)
*C23F 1/00* (2006.01)

(52) U.S. Cl.
USPC .................. 216/68; 216/58; 216/70; 216/71; 438/710; 438/706; 438/729; 156/345.48; 156/345.49; 118/723 I; 118/723 R; 427/571; 427/569; 427/570

(58) Field of Classification Search
USPC ..................... 156/345.48, 345.49; 216/68, 58, 216/67, 70, 71; 427/571, 569, 570; 118/723 I, 118/723 R; 438/706, 710, 724
See application file for complete search history.

(56) References Cited

U.S. PATENT DOCUMENTS

| | | | |
|---|---|---|---|
| 5,234,529 A | 8/1993 | Johnson | |
| 5,304,282 A | 4/1994 | Flamm | |
| 5,309,063 A | 5/1994 | Singh | |
| 5,401,350 A | 3/1995 | Patrick et al. | |
| 5,464,476 A | 11/1995 | Gibb et al. | |
| 5,571,366 A | 11/1996 | Ishii et al. | |

(Continued)

FOREIGN PATENT DOCUMENTS

| | | |
|---|---|---|
| EP | 0908923 A2 | 4/1999 |
| EP | 1662546 A1 | 5/2006 |

(Continued)

OTHER PUBLICATIONS

"Fluxtrol Materials Characteristics", Fluxtrol company materials data sheets.*

(Continued)

*Primary Examiner* — Lan Vinh
*Assistant Examiner* — David Kaufman
(74) *Attorney, Agent, or Firm* — Dority & Manning, P.A.

(57) ABSTRACT

A method and apparatus are provided for processing a substrate with a radiofrequency inductive plasma in the manufacture of a device. The inductive plasma is maintained with an inductive plasma applicator having one or more inductive coupling elements. There are thin windows between the inductive coupling elements and the interior of the processing chamber. Various embodiments have magnetic flux concentrators in the inductive coupling elements and feed gas holes interspersed among the inductive coupling elements. The thin windows, magnetic flux concentrators, and interspersed feed gas holes are useful to effectuate uniform processing, high power transfer efficiency, and a high degree of coupling between the applicator and plasma. In some embodiments, capacitive current is suppressed using balanced voltage to power an inductive coupling element.

11 Claims, 7 Drawing Sheets

U.S. PATENT DOCUMENTS

| | | | |
|---|---|---|---|
| 5,653,811 A | 8/1997 | Chan | |
| 5,711,849 A | 1/1998 | Flamm et al. | |
| 5,811,022 A | 9/1998 | Savas | |
| 5,888,414 A | 3/1999 | Collins et al. | |
| 5,907,221 A | 5/1999 | Sato et al. | |
| 5,939,886 A | 8/1999 | Turner et al. | |
| 5,965,034 A | 10/1999 | Vinogradov et al. | |
| 5,980,766 A | 11/1999 | Flamm et al. | |
| 5,994,236 A | 11/1999 | Ogle | |
| 6,017,221 A | 1/2000 | Flamm | |
| 6,033,481 A | 3/2000 | Yokogawa et al. | |
| 6,056,848 A | 5/2000 | Daviet | |
| 6,080,271 A | 6/2000 | Fujii | |
| 6,127,275 A | 10/2000 | Flamm | |
| 6,178,920 B1 | 1/2001 | Ye et al. | |
| 6,204,607 B1 | 3/2001 | Ellingobe | |
| 6,231,776 B1 | 5/2001 | Flamm | |
| 6,259,209 B1 * | 7/2001 | Bhardwaj et al. | 156/345.12 |
| 6,267,074 B1 | 7/2001 | Okumura | |
| 6,270,687 B1 | 8/2001 | Ye et al. | |
| 6,291,793 B1 | 9/2001 | Qian et al. | |
| 6,321,681 B1 | 11/2001 | Colpo et al. | |
| 6,322,661 B1 | 11/2001 | Bailey, III et al. | |
| 6,380,680 B1 * | 4/2002 | Troxler | 313/607 |
| 6,417,626 B1 | 7/2002 | Brcka et al. | |
| 6,451,161 B1 | 9/2002 | Jeng et al. | |
| 6,516,742 B1 | 2/2003 | Blalock et al. | |
| 6,534,922 B2 | 3/2003 | Bhardwaj et al. | |
| 6,572,732 B2 | 6/2003 | Collins | |
| 6,632,324 B2 | 10/2003 | Chan | |
| 6,649,223 B2 | 11/2003 | Colpo et al. | |
| 6,682,630 B1 | 1/2004 | Colpo et al. | |
| 6,790,311 B2 * | 9/2004 | Collins et al. | 156/345.48 |
| 6,858,112 B2 | 2/2005 | Flamm et al. | |
| 7,005,845 B1 | 2/2006 | Gonzalez et al. | |
| 7,018,506 B2 | 3/2006 | Hongoh et al. | |
| 7,137,444 B2 | 11/2006 | Faybishenko et al. | |
| 2003/0076020 A1 | 4/2003 | Anami et al. | |
| 2003/0192644 A1 | 10/2003 | Pu et al. | |
| 2004/0060517 A1 * | 4/2004 | Vukovic et al. | 156/345.49 |
| 2004/0163766 A1 * | 8/2004 | Kanarov et al. | 156/345.49 |
| 2008/0050292 A1 | 2/2008 | Godyak | |
| 2008/0050537 A1 | 2/2008 | Godyak | |

FOREIGN PATENT DOCUMENTS

| | | |
|---|---|---|
| JP | 10083896 A | 3/1998 |
| KR | 2008-0028848 A | 4/2008 |
| WO | WO 02/084700 A1 | 10/2002 |
| WO | WO 2005/057607 A2 | 6/2005 |

OTHER PUBLICATIONS

Meziani et al., Plasma Sources Science and Technology, vol. 10, pp. 276-283, (2001).*

Design of a magnetic-pole enhanced inductively coupled plasma source, T Meziani, P. Colpo and F. Rossi, Plasma Sources Science and Technology pp. 276-283, Dec. 12, 2000, final form Mar. 29, 2001.

Japanese Journal of Applied Physics, Part 1 Regular Papers, Brief Communications & Review papers, Oct. 2006, vol. 45 No. 10B, Plasma Processing, Effects of Antenna Size and Configurations in Large-Area RF Plasma Production with Internal Low-Inductance Antenna Units, Hiroshige Deguchi et al., pp. 8042-8045.

Principles of Plasma Discharges and Materials Processing, "Inductive Discharges", Michael Lieberman and Allan Lichtenberg, pp. 387-405.

Written Opinion and Search Report for PCT/US07/18557, Sep. 9, 2008.

Supplemental European Search Report and Written Opinion for International Application No. 07811477.4-1226/2087778 PCT/US/07/18557, Oct. 12, 2010.

* cited by examiner

INDUCTIVE PLASMA SOURCE WITH HIGH COUPLING EFFICIENCY

CROSS REFERENCE TO RELATED APPLICATIONS

This application is a division of copending U.S. utility patent application Ser. No. 11/843,595 filed on Feb. 11, 2008 which claimed priority under 35 U.S.C. §119(e) from U.S. Provisional Patent Application Ser. No. 60/839,011 filed on Aug. 22, 2006, the entire contents of both of which are hereby incorporated by reference, and for which priority is claimed under 35 U.S.C. §120.

FIELD OF THE INVENTION

The present invention relates to plasma generation and, more particularly to methods for device processing with inductive plasmas having high coupling efficiency.

BACKGROUND

Inductively coupled plasmas (ICPs) are advantageously used in the manufacture of devices such as integrated circuits, micromechanical devices, flat panel displays, and others. Inductive coupling is often preferred over capacitive coupling because the current flow in an inductive plasma is driven by an electromotive force with no associated scalar voltage differences. Capacitive coupling, on the other hand, can increase plasma potential, thereby causing undesirable parasitic currents and/or discharges between the plasma and various surfaces within the chamber. Relatively large potentials can occur, causing ions to bombard surfaces at high energy, thereby sputtering the surfaces and/or injecting sputter contamination into the process chamber.

Generally, ICPs for processing are maintained within a plasma processing apparatus comprising an applicator (often referred to as an antenna) which couples high frequency electromagnetic energy through a large dielectric window of a processing chamber. In some applications the applicator is a single coil. The dielectric window is generally relatively low loss material such as quartz, alumina, or another ceramic.

Plasma processing is often performed at relatively low pressure. For example, a preselected operating pressure for plasma etching and/or plasma assisted chemical vapor deposition can be in the range of 0.1 milliTorr to 100 Torr, depending on the application. However pressures outside of this range are also operable in some applications.

ICP processing apparatus often has a dielectric window spanning an upper surface of a processing chamber. Electromagnetic flux coupled through the dielectric window sustains an inductively coupled plasma in chamber gas below the window. A workpiece or substrate for processing is commonly supported on a horizontal substrate holder or chuck in the chamber. The dielectric window can be flat, although dome shaped windows have also be used in conventional ICP processing apparatus.

In many applications, such as plasma etching or plasma assisted chemical vapor deposition for the fabrication of integrated circuits, it can be essential to maintain a relatively uniform plasma over the various areas of a substrate being processed. With regards to uniformity, a flat dielectric window is often preferred to a dome shape, since a flat widow provides relatively uniform distance between various portions of the plasma source and the workpiece on the substrate holder. Since gas pressure in the processing chamber can be substantially below one atmosphere, the top dielectric window must be thick enough to withstand mechanical stress arising from atmospheric pressure. Mechanical considerations require that the minimum thickness of the window is approximately proportionate to the window diameter. Where the chamber diameter is sufficient to process a 300 mm semiconductor wafer (approximately 0.5 m diameter), a planar quartz window must be at least a few cm thick to withstand atmospheric pressure.

When processing a workpiece in conventional ICP equipment, there is generally a relatively large distance between the external applicator and plasma in the chamber. Coupling between the applicator and ICP is relatively weak when the distance from applicator to plasma gas is relatively large. In general, RF power loss is more than proportionate to the applicator voltage. For example, RF power loss can increase in proportion to the square of the voltage applied to an applicator. Since weak coupling requires relatively high applicator voltage to transfer a predetermined amount of power to an ICP, it reduces the RF power transfer efficiency. Furthermore, relatively high power loss in the applicator and/or in the matching network is associated with ICP instability. Low efficiency has also made it difficult or unfeasible to maintain a low power and/or low density plasma in an inductive, rather than a capacitive mode. Hence it has been relatively difficult to perform processing at low power or at low plasma density with an ICP. Furthermore, ICP equipment has been burdened with costs of excess power supply capacity and the necessity of removing heat produced in power losses.

Plasma uniformity control is also relatively difficult where there is a substantial separation between the applicator and plasma. In principle, spatial plasma uniformity in the chamber might be improved by using a plurality of applicator coils and directing various amounts of power into coils at different positions adjacent to the window. However there is generally poor spatial correlation between coil current and the adjacent plasma density related to substantial separation between the coils over a window and process gas interior to the chamber. Hence this technique has been relatively ineffective.

Nonuniformity can also arise through nonuniform feed gas introduction. In some capacitive plasma processing equipment, an applicator electrode above a workpiece support has "showerhead" gas distribution holes for selectively introducing feed gas in a uniform manner. Generally, in ICP processing apparatus having an external inductive applicator above a workpiece, a large and relatively thick flat or dome-shaped dielectric window has been necessary to support external atmospheric pressure and allow magnetic flux into the chamber for powering the plasma. Such windows are have often been made from quartz or a ceramic. It has been impractical to introduce feed gas through large thick windows owing to structural/mechanical limitations and/or cost. Hence feed gas has been introduced into these chambers in a different manner. For example, in some ICP processing apparatus, feed gas has been introduced into the processing chamber through a plurality of feed injectors at various positions around the periphery of the substrate and/or below the substrate holder. However it has been relatively difficult to effect uniform gas distribution over the substrate using such means and injectors in the chamber can have adverse effects on plasma uniformity.

It can be seen that there is a need for efficient ICP processing methods having relatively higher coupling between the applicator and plasma. There is also a need for ICP processing with improved power transfer efficiency and uniformity. Furthermore, there is a need for ICP processing methods that are operably stable at low power and/or low plasma density. Still further there is a need for ICP processing methods and apparatus with improved feed gas distribution.

SUMMARY

One aspect of the invention is a method of processing a substrate in the manufacture of a device. The method comprises placing a substrate having a film thereon on a substrate holder within a processing chamber of a processing apparatus and admitting a process gas into the interior of the chamber. The method further comprises maintaining a substantially inductive plasma wholly within the chamber using magnetic flux. The magnetic flux is produced by at energizing least one inductive plasma applicator outside of the processing chamber with radiofrequency power. The method further comprises performing at least one treatment of at least a portion of the film with the substantially inductive plasma in the chamber. The processing chamber comprises at least one or more thin windows less than approximately five millimeters in thickness on a wall of the chamber. The one inductive plasma applicator comprises one or more inductive coupling elements, operable to maintain the substantially inductive plasma wholly within the process gas in the interior of the chamber. In the method, each inductive coupling element among the one or more inductive coupling elements is associated with one thin window selected from among the one or more thin windows less than approximately five millimeters in thickness. Each inductive coupling element also can emit magnetic flux into the chamber interior and receive the magnetic flux returning from the chamber interior through the associated one thin window. At least one inductive coupling element among the one or more inductive coupling elements comprises a magnetic flux concentrator operable to reduce the magnetic path resistance for magnetic flux lines in the inductive coupling element.

In an embodiment of the method, at least 80 percent of the magnetic flux circulated from the each inductive coupling unit into the chamber is within five centimeters of the thin window associated with the each inductive coupling element. In another embodiment, at least a portion of the substrate is within approximately five inches of at least one inductive coupling element selected from among the one or more inductive coupling elements. Furthermore, there is an embodiment where at least a portion of the substrate is within approximately two inches of at least one inductive coupling element selected from among the one or more inductive coupling elements.

In another embodiment of the method at least one inductive coupling element comprises a coil. There is also an embodiment where at least one inductive coupling element comprises a flat coil portion. In a further embodiment at least one applicator comprises a magnetic flux concentrator operable to confine or focus the magnetic flux, in single or in combination. Also, there are embodiments where the magnetic flux concentrator comprises ferromagnetic material having a magnetic permeability relative to vacuum of at least 10 for the magnetic flux. In some of these, there is at least some ferromagnetic material adjacent to a coil portion. In some embodiments the magnetic flux concentrator comprises an approximately inverted U-shape cross section over the coil. An open side of the U-shape cross section faces the thin window associated with the inductive coupling element; and the end of each leg of the U-shape cross section is within approximately five millimeters of the chamber interior.

Another aspect is an apparatus for processing a substrate using an inductive plasma. The apparatus comprises a processing chamber having an interior operable to confine a process gas, a substrate holder in the interior of the processing chamber operable to hold a substrate, and an inductive plasma applicator comprising one or more inductive coupling elements. The inductive plasma applicator is operable to maintain a substantially inductive plasma wholly within the process gas in the interior using radiofrequency power. The apparatus also comprises at least one or more thin windows less than five millimeters in thickness on a wall of the chamber operable to isolate an inductive coupling element from the process gas. In this aspect each inductive coupling element among the one or more inductive coupling elements is associated with a thin window selected from among the one or more thin windows less than five millimeters in thickness. At least a portion of each of the one or more inductive coupling elements is within five millimeters of the chamber interior. Each of the one or more inductive coupling elements is operable to emit magnetic flux into the chamber interior and to receive the magnetic flux returning from the chamber interior through the associated at least one thin window, whereby the magnetic flux circulates through the interior of the processing chamber.

In various embodiments, the thin window is operable to support a pressure differential of at least one atmosphere. There are embodiments where at least one of the one or more inductive coupling elements comprises a coil portion. In further embodiments, at least one of the one or more inductive coupling elements comprises a magnetic flux concentrator operable to confine or focus, in single or in combination, magnetic flux emitted from the at least one inductive coupling element or received in the one or more inductive coupling element, in single or in combination. In embodiments the magnetic flux concentrator comprises ferromagnetic material having a magnetic permeability relative to vacuum of at least 10 for the magnetic flux.

There is an embodiment where the magnetic flux concentrator comprises an approximately inverted U-shape cross section over the coil. In this embodiment an open side of the U-shape cross section faces the thin window associated with the inductive coupling element and the end of each leg of the U-shape cross section is within approximately five millimeters of the chamber interior.

A further aspect is an apparatus for processing a substrate using an inductive plasma comprising a processing chamber having an interior operable to confine a process gas, and a substrate holder in the interior of the processing chamber operable to hold a substrate. This aspect also includes an inductive radiofrequency plasma applicator comprising one or more inductive coupling elements over the substrate within five millimeters of the interior of the chamber. The inductive plasma applicator is operable to maintain a substantially inductive plasma wholly within the process gas in the interior of the chamber. The aspect still further comprises a plurality of thin dielectric windows less than approximately five millimeters in thickness, an applicator wall over the substrate comprising a plurality of recesses for the external inductive coupling elements, and a plurality of feed gas holes interspersed among the inductively coupled elements over the substrate;

Each recess selected from among the plurality of recesses is operable to receive at least one thin dielectric window, selected from among the plurality of thin dielectric windows, at an interior wall of the chamber, and receive least one inductive coupling element, selected from among of the one or more inductive coupling elements, in a position adjacent to the selected thin window within approximately five millimeters of the chamber interior. Also the at least one selected thin dielectric window is operable to isolate the at least one selected inductive coupling element from the process gas and support a pressure differential of at least one atmosphere. Furthermore each of the one or more inductive coupling elements is operable to emit magnetic flux into the interior of the processing chamber and to receive the magnetic flux returning from the interior of the processing chamber through the associated at least one thin window. Hence the magnetic flux circulates through the interior of the processing chamber.

In various embodiments of the aspect, at least one of the one or more inductive coupling elements comprises a magnetic flux concentrator. The magnetic flux concentrator is operable to confine or focus, in single or in combination, magnetic flux emitted from the at least one inductive coupling element or received in the one or more inductive coupling element, in single or in combination. There are embodiments where the magnetic flux concentrator comprises ferromagnetic material having a magnetic permeability relative to vacuum of at least 10 for the magnetic flux.

In some embodiments a processing chamber cross section is approximately polygonal. Also, in various embodiments, the substrate holder is operable to hold the substrate within approximately five inches of at least one inductive coupling element selected from among the one or more inductive coupling elements. Furthermore, there are embodiments where the apparatus is operable to deliver a first preselected flow rate of a feed gas through first feed gas holes selected from among the plurality of feed gas holes, and to deliver a second preselected flow rate of the feed gas through second feed gas holes selected from among the plurality of feed holes.

BRIEF DESCRIPTION OF DRAWINGS

Various embodiments are illustrated in an exemplary manner by the accompanying drawings. The drawings and accompanying description should be understood to explain principles of the embodiments rather than be limiting. Other embodiments will become apparent from the description and the drawings.

DETAILED DESCRIPTION

Methods and apparatus for processing with an RF inductive plasma are disclosed. In some aspects, there is enhanced coupling between an inductive plasma applicator and plasma. In embodiments, a plasma processing apparatus comprises a process chamber and a radiofrequency inductive plasma applicator at a wall of the chamber. The inductive plasma applicator comprises one or more radiofrequency inductive coupling elements (ICEs). The apparatus also has one or more thin dielectric windows on the applicator wall. One of the thin dielectric windows isolates each ICE from the gas of a substantially inductive plasma wholly in the interior of the chamber. The plasma receives inductive power coupled through the thin dielectric windows from the ICEs. Close proximity between each ICE and the process gas effectuates a relatively high degree of coupling with the plasma.

In various aspects the thin windows are relatively narrow so that they can provide sufficient mechanical strength to support external atmospheric pressure when there is vacuum in the chamber. Various embodiments provide a high power transfer efficiency from the RF power source and/or applicator to the plasma. Furthermore, in some embodiments plasma uniformity is obtained with selective powering of various ICEs.

In various embodiments an ICE includes a coil. RF current flow through an ICE from an RF power source induces an electromagnetic field that is localized within a relatively limited zone proximate to the coupling element. The electromagnetic field of a coupling element is relatively attenuated beyond the localized zone. Accordingly, major structural and load bearing portions of an applicator wall in zones not subject to an intense RF field can be comprised of relatively strong and/or inexpensive materials that are not well suited for being in a strong RF field or for coupling power from the ICEs. For example, aluminum, steels, polar materials such as polyvinyl chloride or epoxy, and/or various composites can be used in the load bearing portions.

Figure 1:
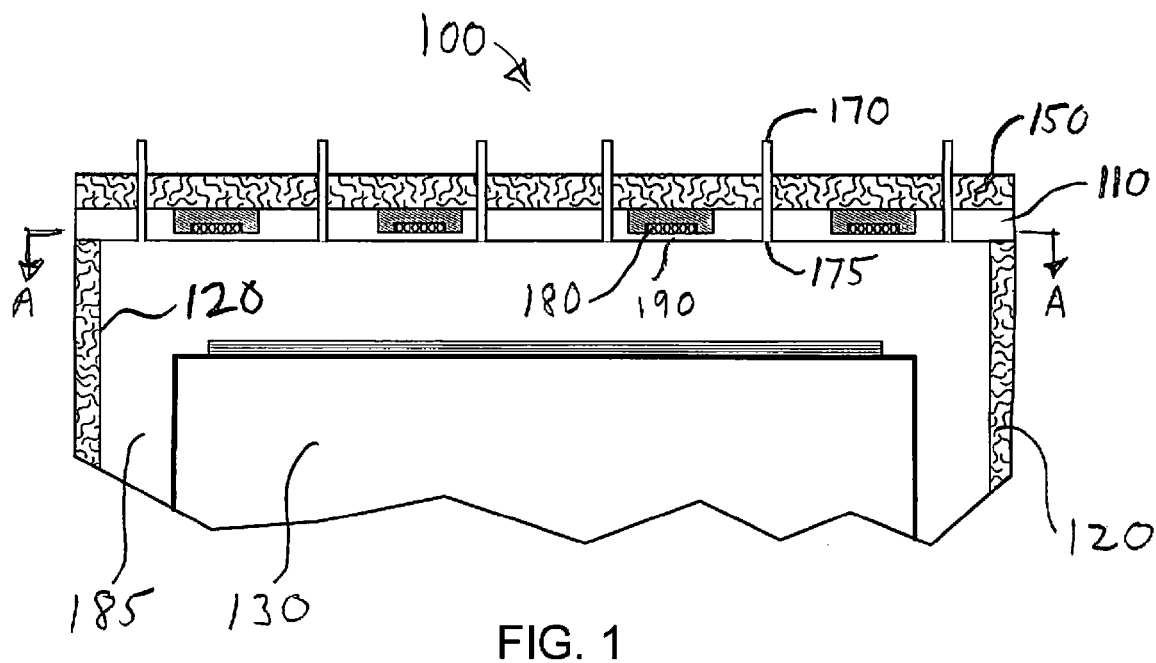
FIG. 1 is a simplified cross-sectional view of a portion of an inductive plasma processing chamber.

In some embodiments an applicator wall of the chamber is made using a thick dielectric fabricated with unitary thin windows (see, for example, thin window portion 190 of the lower applicator wall dielectric 110 in FIG. 1). Other embodiments have at least one thin and relatively narrow discrete dielectric window segment in a recess and/or channel of a relatively thick, load bearing chamber wall. The thin dielectric window in the recess is interposed between an ICE and the plasma processing chamber. The thin window and receiving channel width are sufficiently narrow to allow the relatively thin dielectric window to withstand atmospheric pressure.

In some embodiments the chamber profile is approximately a circular cylinder and the coil and the dielectric window are positioned at a flat upper end of the cylindrical chamber. However, chamber shape does not limit the scope of the claims. In further embodiments the cross-section of the chamber can be rectangular, elliptical, polygonal, and others.

In general, a relatively higher coupling coefficient between an external applicator and ICP in a chamber is attained as distance between the applicator and interior of the chamber is reduced. In various embodiments, a thin window allows the applicator to be relatively proximate to the process gas in which an ICP is sustained in the processing chamber. A relatively high coupling coefficient between the applicator and ICP generally results in more efficient power transfer.

In further embodiments, various inductive coupling elements can be selectively energized. In some embodiments, different selected amounts of power in a selected phase relationship are coupled to the various inductive coupling elements of the applicator and effect a predetermined spatial distribution of plasma density and/or potential. For example, in some embodiments selected amounts of power are transferred from various element coils in a manner that results in a relatively uniform plasma density. Furthermore, in some embodiments selective amounts of phase and antiphase power are coupled in a manner to maintain an ICP within a preselected voltage from ground potential. The amounts of phase and antiphase power can be balanced with respect to a ground potential to mitigate and/or substantially eliminate capacitive current between the plasma and the inductively coupled applicator.

The terminology herein is for the purpose of describing particular embodiments and is not intended to be limiting of the invention. It will be understood that, although the terms first, second, etc. may be used to describe various elements, these terms are only used to distinguish one element from another and the elements should not be limited by these terms. For example, a first element could be termed a second element, and similarly a second element could be termed a first element, without departing from the scope of the instant description. As used herein, the singular forms "a", "an" and "the" are intended to include the plural forms as well, unless the context clearly indicates otherwise. It will be further understood that the terms "comprises," "comprising," "includes," "including," and/or "having," as used herein, are open-ended terms of art that signify the presence of stated features, integers, steps, operations, elements, and/or components, but do not preclude the presence or addition of one or more other features, integers, steps, operations, elements, components, and/or groups thereof. Reference in the specification to "one embodiment", "an embodiment", or some embodiment, etc. means that a particular feature, structure, or characteristic described in connection with the embodiment is included in at least one embodiment. The appearances of the phrase "in one embodiment" in various places in the specification are not necessarily all referring to the same embodiment, nor are separate or alternative embodiments mutually exclusive of other embodiments.

The term module refers to a distinct unit that is operable to perform an identifiable function. A module can be a self-contained physical unit or piece of equipment. A module can also be a logical component effectuated by a processor and tangible media having instructions and/or data that are operable for the processor to perform the identifiable function. The term automatic refers to a module, service, or control system that is operable to perform with no human interaction.

The term gas or gas phase species as used herein includes species not bound to each other that have thermal and/or directed motion, and is not limited by a mean free path between collisions. Hence the term includes atomic or molecular beams, species in a vacuum, and the like.

The term radiofrequency as used herein refers to an oscillation frequency between approximately 50 kHz and 5,000 GHz. Hence the term includes electromagnetic waves having very long wavelengths in air as well as those having millimeter wavelengths. The term applicator refers to a device for coupling radiofrequency electromagnetic energy into a plasma. An applicator can comprise inductive elements such as coils, capacitance coupled to a plasma, and/or means for launching a propagating electromagnetic wave. An inductive applicator refers to an applicator that is operable to couple energy to a plasma predominantly with a time-varying magnetic field.

As used here, various terms denoting spatial position such as above, below, upper, lower, leftmost, rightmost and the like are to be understood in a relative sense. The various aspects of the apparatuses described herein are operable without regard to the spatial orientation of the apparatuses as a whole. For example, an apparatus can be configured in a vertical orientation or in a horizontal orientation. Hence a component or module that is described as being above another component or module in a first embodiment having a first orientation, could equivalently be described as being to the left of the other component or module in an equivalent second embodiment configured to be in a second orientation 90 degrees counterclockwise with respect to the first.

An inverted U-shaped cross section refers to a cross section that has a substantially continuous top joining with two approximately lateral sides having approximately equal length. This term will be understood to include cross sections such as those through an inverted glass or cup, as well as the cross section of a rotationally symmetric recess cut into one side of a plate. In some aspects, this type of cross section can also be referenced as a c-shaped cross section.

The present teachings may be embodied in various different forms. In the following description, for purposes of explanation, numerous specific details are set forth in the description and drawings in order to provide a thorough understanding of the various principles. Furthermore, in various instances, structures and devices are described and/or drawn in simplified form in order to avoid obscuring the concepts. However, it will be apparent to one skilled in the art that the principles can be practiced in various different forms without these specific details. Hence aspects of the disclosure should not be construed as being limited to the embodiments set forth herein.

A number of aspects can be understood with reference to the simplified cross-sectional diagram of an ICP processing apparatus in FIG. 1. The apparatus includes a processing chamber 100 having an interior volume 185, an upper applicator wall portion 150 and a lower applicator wall portion 110. In various embodiments, the processing chamber cross section is generally circular as can be seen with respect to the view shown in FIG. 2 of circular lower applicator wall portion 110. However in other aspects the processing chamber can be rectangular, hexagonal, and other shapes. The shape of the chamber and corresponding applicator wall do not limit the scope of the claims.

The apparatus includes a plasma applicator comprising at least one ICE. The lower applicator wall portion 110 includes a number of recesses 155 for ICEs of the inductive plasma applicator. The ICEs comprise magnetic flux concentrators 160 and conductors 180. Each of the ICEs is proximate to interior wall 115 of the chamber. Interior wall 115 comprises associated thin window portions 190 and the lower surface of applicator wall portion 110. A substrate 140 is held on a substrate holder 130 in the chamber for processing with the inductive plasma processing apparatus.

The width of each window is much smaller than the span of the chamber. A relatively thin strip window can withstand a pressure that would rupture a large uniformly thin window. For example, in various embodiments relative to FIG. 1 and/or FIG. 2, a wafer substrate 300 millimeters in diameter is processed and the span of the chamber (a diameter of an applicator wall comprised of an upper portion 150 and a lower portion 110) is more than 300 mm. In these embodiments a thin strip window less than 5 millimeters thick is used and an associated ICE is positioned immediately adjacent to the window. Hence ICEs are very close to the chamber gas where inductive plasma current is induced.

The relatively small distance between the ICE and current carrying portion of the plasma is associated with a relatively large the mutual coupling coefficient between the coupling element and the current path in the plasma. For example, in one embodiment the distance between an ICE and gas in the chamber is about 3 millimeters, and the coupling coefficient is greater than 0.5. It also has been found that a high power transfer efficiency can be obtained when each ICE is relatively close to the plasma.

Still further, the path of plasma current induced by the proximate ICE is relatively narrow and largely localized in a region of the chamber adjacent to that element. Plasma current path induced from a coupling element through a relatively thick conventional window (greater than about a centimeter in thickness), on the other hand, was found to be distributed over a relatively large volume above the substrate and to extending a relatively large distance from the coupling element.

In a number of embodiments, feed gas can be continuously introduced through a plurality of feed gas holes 125. The feed holes can receive process gas through tubular channels 190. In some processing applications, the interior volume of the chamber 100 is maintained at low pressure. A preselected chamber pressure can be maintained using conventional pressure sensing devices (capacitance manometers, ion gauges, liquid manometers, spinning rotor gauges, and others), pumps such as oil based pumps, dry mechanical pumps, diffusion pumps, and others, and pressure control means such as automatic feedback control systems and/or conventional manual controls. The various aspects do not depend on having any specific type of pumping system, pressure sensing means, or a preselected pressure. In vacuum processing applications, the applicator wall, comprised of portions 150 and 110, and the lateral chamber walls, can support a pressure differential of at least one atmosphere.

Figure 2:
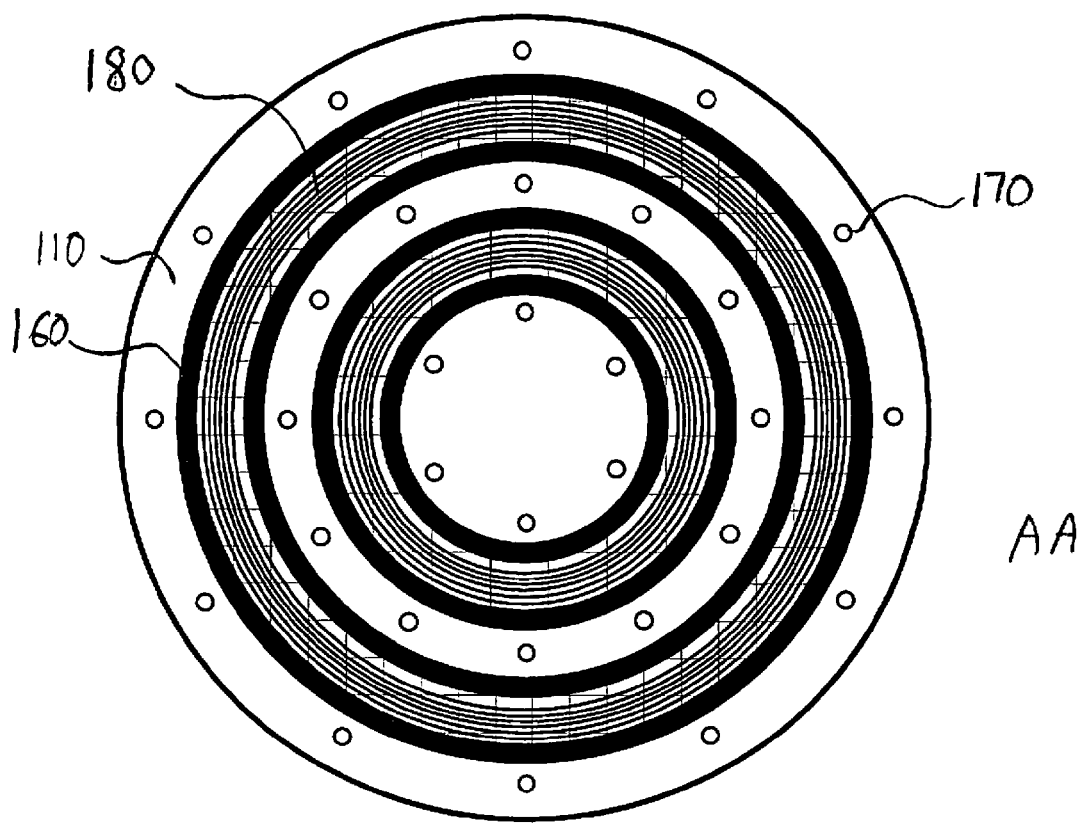
FIG. 2 is a simplified inside view of the top of a circular processing chamber, in a relation to FIG. 1.

It has been found that introducing feed gas through holes interspersed among ICEs over the substrate provides excellent process uniformity. Illustrative distributions of feed holes among the ICEs are shown in FIG. 1 and FIG. 2. However different numbers and distributions of holes are useful in further embodiments. Furthermore, in some applications, process uniformity is improved where different feed gas flow rates are directed to the various holes. For example each feed hole with respect to FIG. 1 and/or FIG. 2 can be configured to admit a preselected flow rate of process gas to chamber 185.

In various embodiments with respect to FIG. 1, each of the feed holes 175 is separately coupled to a gas supply through an associated gas connection 170 on the top applicator wall. However some embodiments have other configurations. For example, there are embodiments where a number of "showerhead" feed holes on the inner face of the applicator wall are configured to receive processing gas from an internal manifold within the applicator wall (not shown). In some of these embodiments one manifold supplies feed gas to all of the holes. In different embodiments, there are a plurality of manifolds within the top applicator wall. Each of these manifolds supplies feed gas to preselected feed holes, and each manifold has an external connection to receive an independent flow of a feed gas. Hence a flow of feed gas to each manifold and its associated feed holes can be independently adjusted to improve processing uniformity.

Still further embodiments comprise feed gas delivery means to deliver process gas through inlets at various other positions in the chamber. Inlets can be holes, slits, nozzles and/or other shapes. For example, there is an embodiment where feed gas is introduced into the chamber through slits on the perimeter sidewall 120 of the chamber. In a further embodiment, feed gas is introduced through holes on the side of the substrate holder. In some of these further embodiments, there are no feedholes interspersed among ICEs on the top applicator wall. Various aspects of the invention do not depend on delivering feed gas from gas delivery apertures between the ICEs at a chamber applicator wall.

The material comprising upper applicator wall portion 150 with respect to FIG. 1 can comprise a relatively strong material such as stainless steel, a corrosion-resistant metal alloy, aluminum, titanium, various composite materials, and/or others, in single or in combination, with a thickness sufficient to support a predetermined differential pressure. In various embodiments, pressure force on the lower applicator wall portion 110 can be partly or wholly transferred to the upper applicator wall portion 150. For example, force can be transferred by way of mechanical and/or adhesive bonding between lower applicator wall portion 110 and upper applicator wall portion 150. In some applications, the chamber pressure is approximately vacuum and the force of atmospheric pressure on the lower applicator wall portion is supported with the upper applicator wall portion. Hence the lower applicator wall portion can be comprised of a relatively weak or brittle material such as a silica based glass, quartz, chemically resistant plastics, and/or others. In various embodiments an ICE 190 can be within approximately 5 mm of the interior of the chamber 185, and the dielectric window 190 associated with the respective ICE 190 can be less than 5 mm in thickness. In some embodiments the sidewalls 120 of the chamber are a stainless steel or aluminum alloy. However the embodiments do not depend on the sidewall material and non-dielectric portions of the chamber wall can be any composition having sufficient mechanical properties and chemical compatibility with the process.

For processing, each ICE of the applicator is energized with current from a conventional radiofrequency (RF) power source (not shown). RF current flows from the power source through conductors 180 of the inductive coupling element thereby producing magnetic flux. Each ICE also has a magnetic flux concentrator 160. The magnetic flux concentrator is operable to reduce the magnetic flux resistance for magnetic flux lines in the ICE. A magnetic flux concentrator can also confine and/or concentrate magnetic flux for circulating through the chamber volume. The magnetic flux circulated from the applicator through the chamber volume is operable induce sufficient current through a plasma wholly within chamber volume185 to maintain a substantially inductive stable plasma. In various embodiments, the magnetic flux concentrator of an inductive coupling unit can provide relatively high magnetic flux in a region of the chamber that is generally localized relatively close to the inductive coupling unit and associated window. In various embodiments the majority of the magnetic flux within the chamber from an ICE is localized between the associated window and substrate.

The magnetic flux concentrator comprises material having substantial magnetic permeability. In this regard a magnetic material permeability relative to vacuum of approximately 10 or greater at the RF power frequency is substantial, although a relative permeability of approximately 40 or more is preferable. The material can be a low loss ferromagnetic material such as Q1, Q2, or Q3 Ni—Zn ferrite material which are commercially available from the National Magnetics Group, Inc. of Bethlehem, Pa., 4F1 or 4C4 material and the like made by the Ferroxcube Corp. of Eindhoven, The Netherlands, and other low loss magnetic materials. Those of ordinary skill in the art will appreciate that the loss factor of a ferromagnetic medium depends on the RF excitation frequency. Hence the suitability a material in any particular application depends on the selected power frequency.

The conductor can be a coil comprised of a low resistivity metal such as silver or copper. However other metals or a composite conductor can also be used. For example there are embodiments having a coil comprised of a high conductive layer copper film coated on a poor conductor such as iron or on a nonconductive material.

The lower applicator wall portion 100 is comprised of a dielectric material that is substantially transparent to electromagnetic fields from the ICEs of the applicator. Quartz, borosilicate glass, sapphire, diamond, ceramic, fluoropolymer, and various other dielectric materials and/or composites can be used as the dielectric, depending on the embodiment, In this regard, the term dielectric is intended to include various high resistance materials that absorb and/or reflect relatively little energy from the electromagnetic field of the inductive applicator. In some embodiments, silicon carbide, silicon, and low loss composite materials are useful dielectrics.

Figure 3:
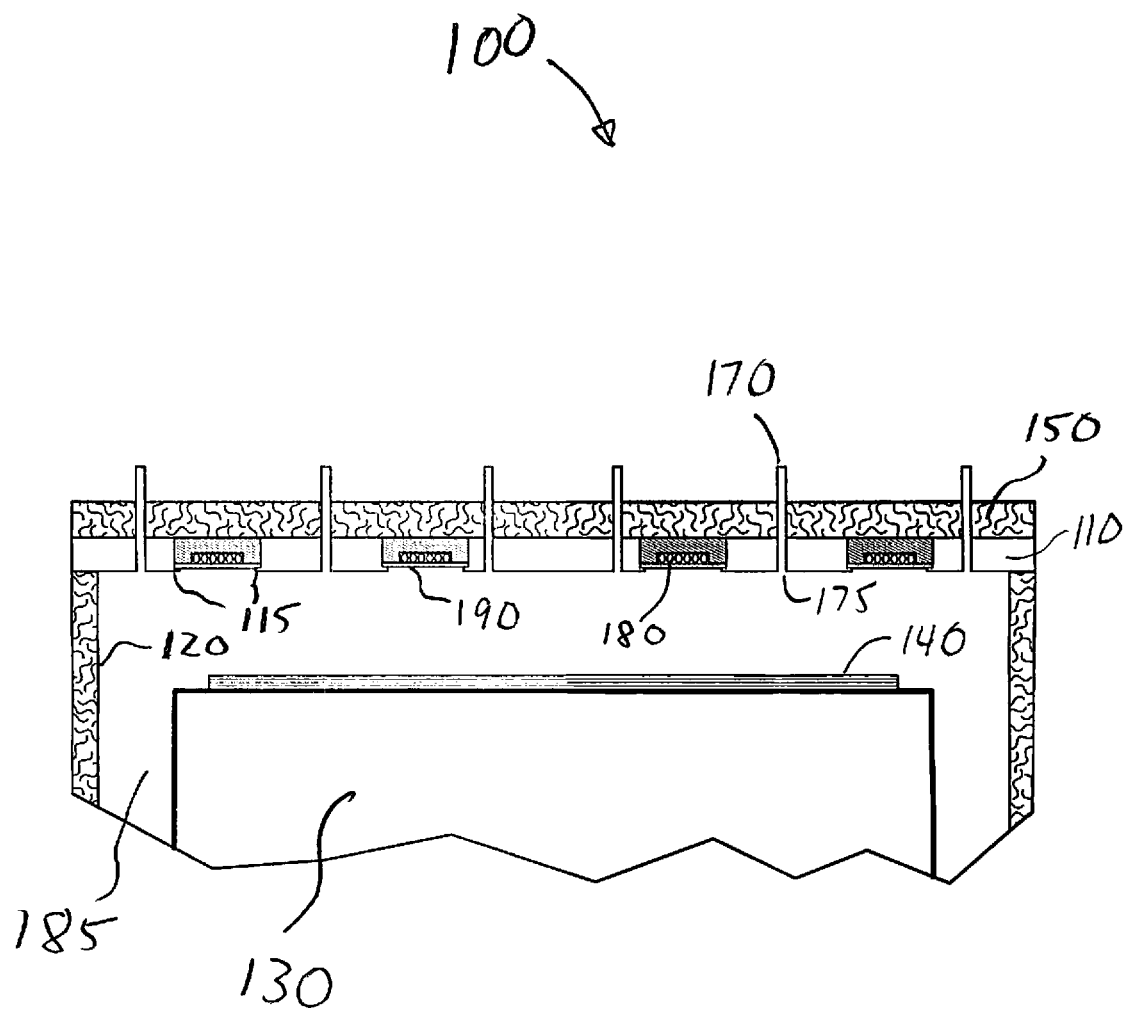
FIG. 3 is a simplified cross-sectional view of another embodiment of an inductive plasma processing chamber.

Another embodiment of an inductive plasma processing apparatus can be described with respect to the simplified cross sectional diagram of FIG. 3. A thin annular dielectric window 190 is supported on lips 188 of lower applicator wall portion 110. The lower applicator wall portion 110 can be comprised of an insulating or conductive material with sufficient mechanical strength to sustain at least one atmospheric pressure. Alternatively, the lower applicator wall portion can be configured to sustain atmospheric pressure when it is mechanically and/or adhesively bonded to upper applicator wall portion 150. In various embodiments there are seals (not shown). For example, in a number of embodiments there is a gas tight seal between window 190 and the supporting lips of lower applicator wall portion 110. There can be a gas tight seal between upper and lower applicator wall portions 150 and 110, and/or between the upper applicator wall and reactor sidewalls 120 in some embodiments. Depending on the embodiment, gas tight seals can have conventional o-rings, gaskets, polymeric material that is cross linked in situ, glass to metal solder, and others (not shown).

Although an embodiment with respect to FIG. 3 with upper and lower applicator wall portions has been described, upper and lower applicator wall portions do not limit the scope of the claims. There are aspects when applicator wall is unitary. For example, in various embodiments there is a unitary pressure bearing applicator wall 110 having with no upper portion 150. However in some of these embodiments, there is a protective cover, such as a relatively thin metal, insulating, or composite cover on top of the unitary wall (in a position corresponding to 150). In other embodiments, only the ICEs recesses 155 have covers.

Figure 4A:
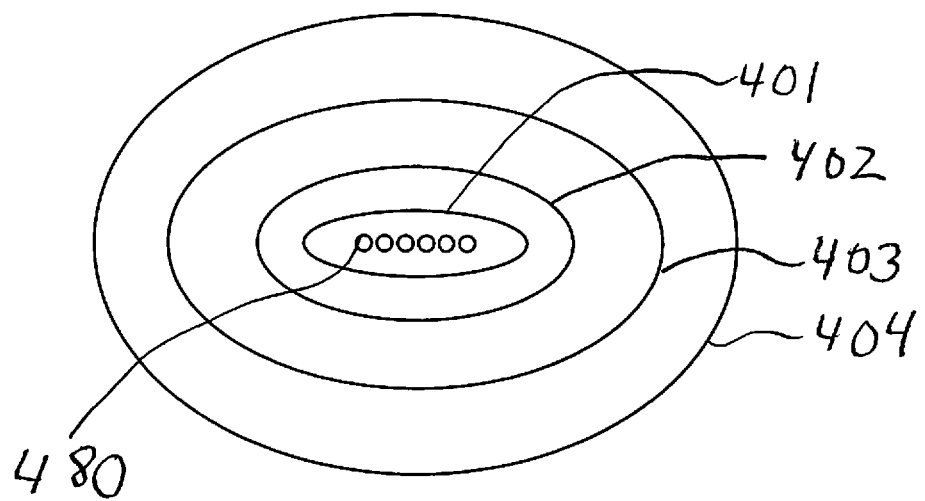
FIG. 4a is a simplified drawing of magnetic flux lines surrounding a current carrying flat coil.
Figure 4B:
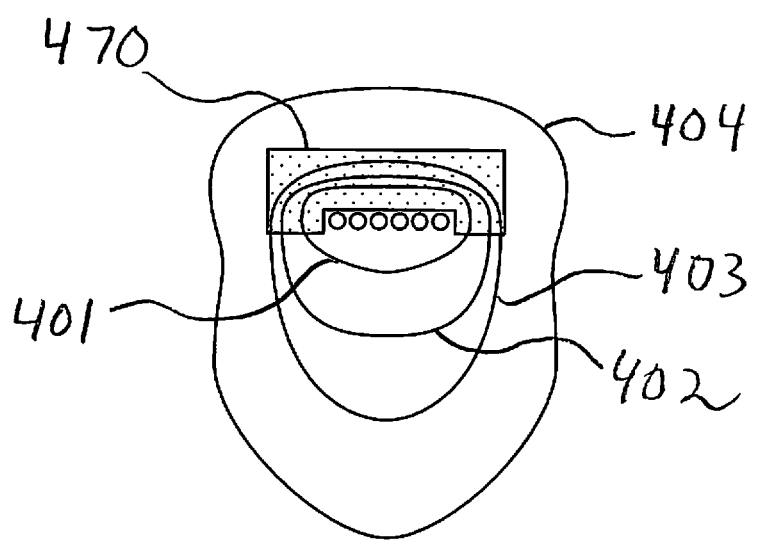
FIG. 4b is a simplified drawing of magnetic flux lines surrounding a current carrying flat coil with a magnetic flux concentrator.

Various advantages of a magnetic flux concentrator can be further understood with reference to the simplified drawings in FIGS. 4A and 4B. FIG. 4A is a simplified drawing of some magnetic flux lines, 401,402, 403, 404, around a conventional flat coil 480 carrying current. The coil in FIG. 4A has no magnetic flux concentrator. The magnetic field lines around this current carrying coil are generally symmetric, and, as illustrated, they extend an appreciable distance above and below the coil, and to each side of the coil. Magnetic field lines produced by this configuration are relatively diffuse. and there is relatively low field strength in the area immediately underneath the coil. When there is plasma beneath the coil illustrated in FIG. 4A, inductive coupling between the coil and plasma is relatively weak.

The drawing in FIG. 4B illustrates magnetic field lines when there is a magnetic flux concentrator 470 coupled to coil 480. The substantially permeable magnetic flux concentrator reduces magnetic path resistance for magnetic flux lines in the concentrator medium. Owing in part to this effect, the magnetic flux concentrator is operable to confine or focus, in single or in combination, magnetic flux lines 401, 402, 403, 404 resulting from current flow in the coil. The upper portions of magnetic flux lines 401, 402, and 403 are confined within the concentrator. The magnetic flux lines in FIG. 4B are concentrated into the flux concentrator and emerge from the concentrator in a downward direction, extending relatively deeper into the space below the coil and providing a relatively more intense field in that space than that obtained in FIG. 4A. In embodiments with respect to FIG. 4B, the magnetic flux concentrator comprises an approximately inverted U-shape cross section over the coil. In ICEs comprising a U-shape magnetic concentrator cross-section, each leg of the inverted U-shape can be proximate to a dielectric window and within five millimeters of the chamber interior.

Figure 5:
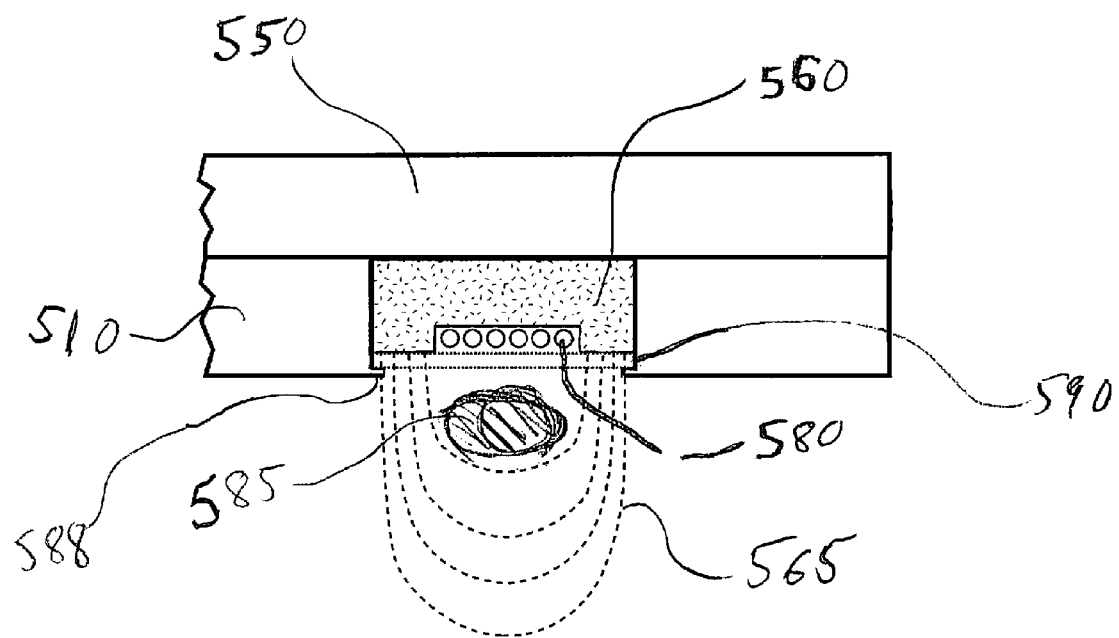
FIG. 5 is a simplified view of a portion of one inductive coupling unit according to FIG. 3, showing some magnetic flux lines and plasma current within the lines.

FIG. 5 further illustrates an ICE in a recess of lower portion 150 of an applicator wall. A thin window 590 is supported on lips 588 of the applicator wall. Current flowing through turns of flat coil 580 produce magnetic flux lines 565 that are confined in inverted U-cross section magnetic flux concentrator 560 and focused into the chamber. The thin window isolates the ICE from process gas and a plasma maintained in the chamber. Circulating magnetic flux lines 565 are localized in a relatively limited volume near the coupling chamber volume. The circulating flux induces current flow and thereby injects power in a relatively localized plasma volume 585 in the vicinity of the applicator. Hence power delivered to the applicator is deposited predominately within a plasma volume localized close to the applicator. In various embodiment 80 percent or more of the magnetic flux circulated from each ICE is within five centimeters of the active coupling element.

In further embodiments a magnetic flux concentrator and/or a coil can have various other configurations. For example, a magnetic concentrator can have a rectangular cross section subtending only the top of a coil (e.g. without legs of a U along the sides of a coil), an inverted A-shape, and other configurations operable to reduce the magnetic path resistance for magnetic flux lines around a conductor. A magnetic flux concentrator can comprise a unitary ring, a plurality of generally flat or U-shape segments, and others. Also, the conductor in an applicator can have various configurations. For instance, the conductor can be a single turn, multiturn flat coil such as shown in FIG. 3 or FIG. 4B, a coil comprising a plurality of turns in a round or rectangular bundle, and others. However an inverted U-shape cross section comprising magnetic media around flat coil, such as a cross section shown similar to that shown in FIGS. 1, 3, 4B, and FIG. 6 is preferred in various applications.

Having localized RF power injection in the vicinity of the inductive coupling element provides means for adjusting plasma uniformity. In various aspects, the plasma density profile can be adjusted by selectively injecting power into the various regions of plasma in the vicinity of different applicators. In general, a larger number of applicators provides a relatively more spatial control of the plasma density distribution. In a number of embodiments there is an ICE with approximately five inches of each portion of the substrate. In some embodiments there is an ICE within approximately two inches of each portion of the substrate.

Depending on the application, single gases or a blend of process gases can be admitted to the process chamber. In various aspects a gas can be evacuated from the chamber 102 by compatible pumping means such as a roots blower, a turbomolecular pump, a "dry" mechanical pump, a diffusion pump, and/or others, in single or incombination. Those of ordinary skill in the art will recognize that different process gases such as, merely by way of example, helium, argon, chlorine, bromine, hydrogen, fluorohydrocarbons, nitrogen, oxygen, silane, disilane, nitrogen trifluoride, water vapor, ammonia, and mixtures thereof, are useful for plasma processing, depending on the application. However these gases are not limiting and various other gases and mixtures of gases can be used, depending on the application. Furthermore, various discrete pressures, a sequence of discrete pressures, and/or a predetermined continuously changing pressure as a function of time are used for plasma processing in embodiments.

Figure 6:
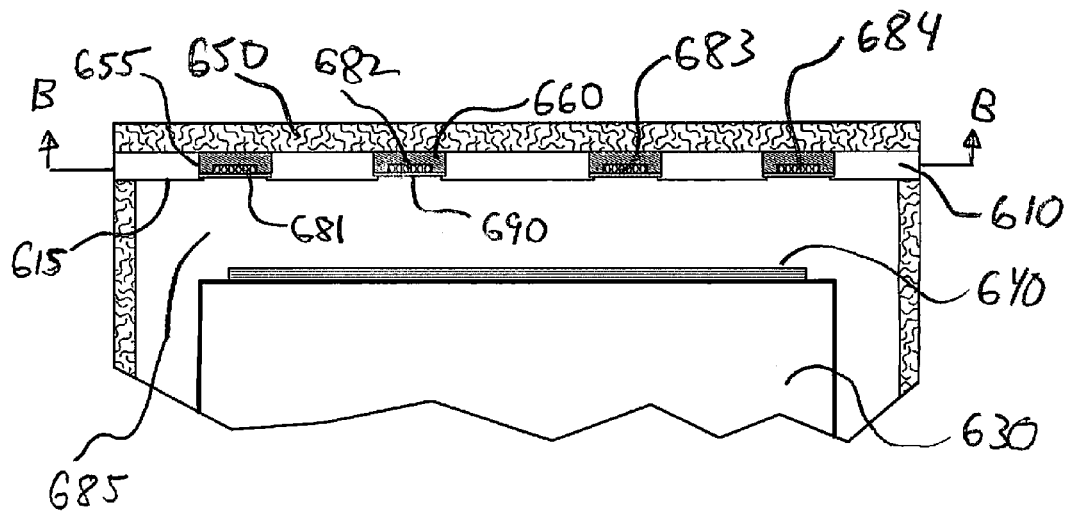
FIG. 6 is a simplified cross-sectional view of a portion of another embodiment of a inductive plasma processing chamber.
Figure 7:
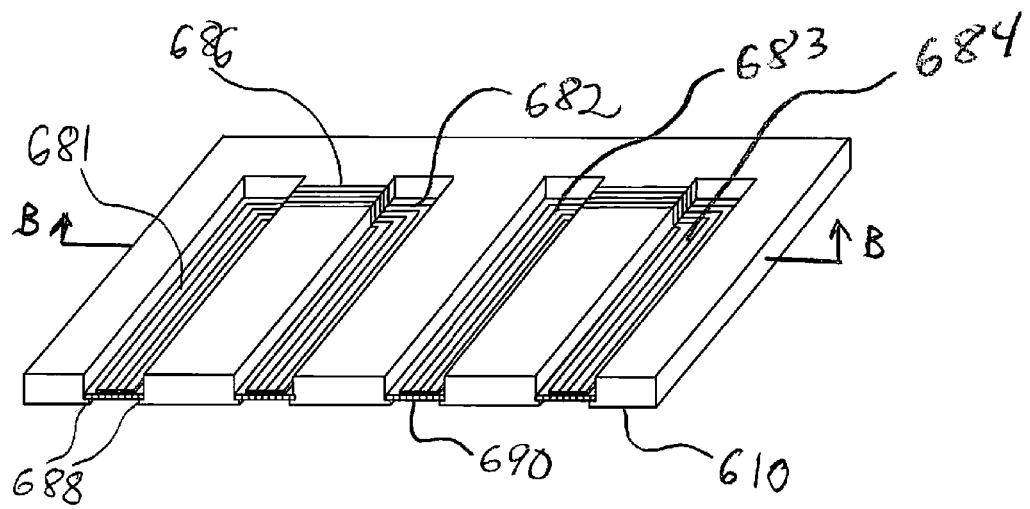
FIG. 7 is a simplified perspective view showing a portion of a portion of a plasma processing apparatus having a rectangular shape, in a relation to FIG. 6.

Additional embodiments can be described with respect to the simplified diagrams in FIG. 6 and FIG. 7. FIG. 6 is a simplified cross sectional view of a rectangular processing chamber in an ICP processing apparatus. A rectangular geometry is particularly suitable for processing panels such as flat panel displays, rectangular solar cells, and others. The apparatus includes a plasma applicator comprising at least one ICE. The lower applicator wall portion 610 includes a number of slots 655 for ICEs of the inductive plasma applicator and thin dielectric strip windows 690. Each ICE comprises a magnetic flux concentrator 660 and conductors arranged in an approximately planar array 680 (also referenced as a flat coil portion). Furthermore, each of the ICEs is associated with one thin dielectric strip window. A substrate 640 is held on a substrate holder 630 in the chamber for processing.

The thin dielectric strip windows 690 are supported on lips 688 abutting the lower portion 610 of the applicator wall. In various embodiments, the thin dielectric strip windows are less than approximately 5 mm in thickness. Each ICE has an inverted U-cross section magnetic flux concentrator 660. Rectangular upper applicator wall portion 650 reinforces lower applicator wall portion 610 and serves as a protective cover for the ICEs. As shown in the perspective view in FIG. 6, there can be interconnections 686 between corresponding conductors of coil portions 680 in pairs of adjacent ICEs 681 and 681 and 683 and 684.

Figure 8:
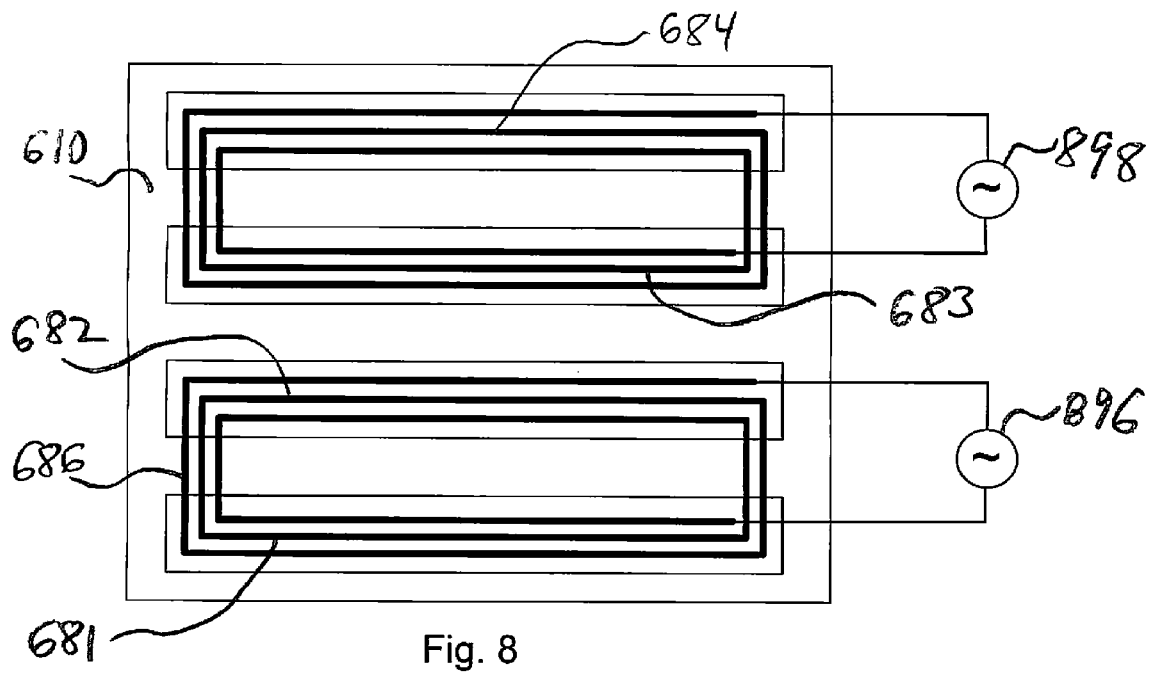
FIG. 8 is a simplified top view of another embodiment of a coil applicator over strip windows.

In various embodiments, ICEs can be connected and/or powered in alternative manners. With respect to FIG. 8, the coil portions of each ICE in a pair of ICEs interconnected with respect to FIG. 7 can be further interconnected with interconnections 687 and powered using a single RF power source 896. A different power source 898 can selectively power a separate pair of ICEs. Power delivered to each respective pair, and/or the relative phase of the power delivered to each pair, can be selectively adjusted to optimize plasma uniformity. Although separate RF power sources 896 and 898 are shown in FIG. 8, a single power source and conventional resonant and/or non-resonant power splitters and phase adjustment networks are operable to selectively deliver power to various ICEs and/or ICE pairs in a predetermined relative phase relationship.

Figure 9:
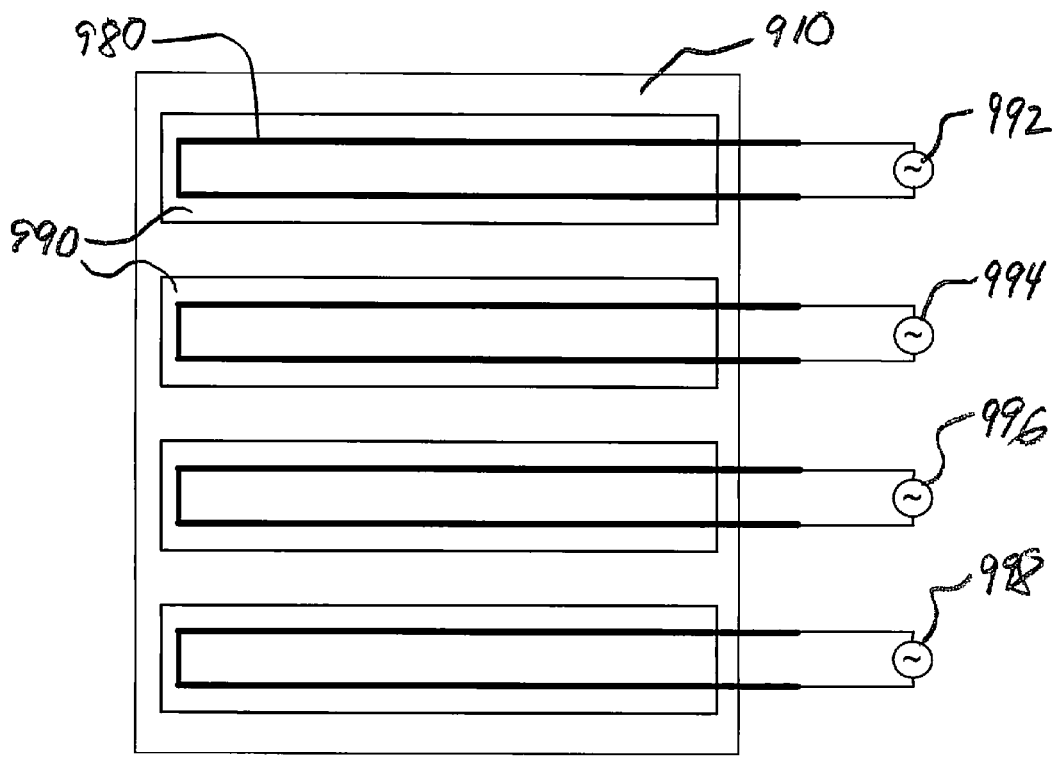
FIG. 9 is a simplified diagram of another embodiment of a coil applicator over strip windows.

In further embodiments ICEs can be powered in different ways. For example, FIG. 9 shows an illustrative configuration where RF power is selectively delivered to each of four ICEs. In still further embodiments, a plurality of ICEs can be coupled in parallel, in series, or they can be combined into various combinations of series and parallel connections. The scope of the claims is not limited by any ICE connection topologies.

Figure 10A:
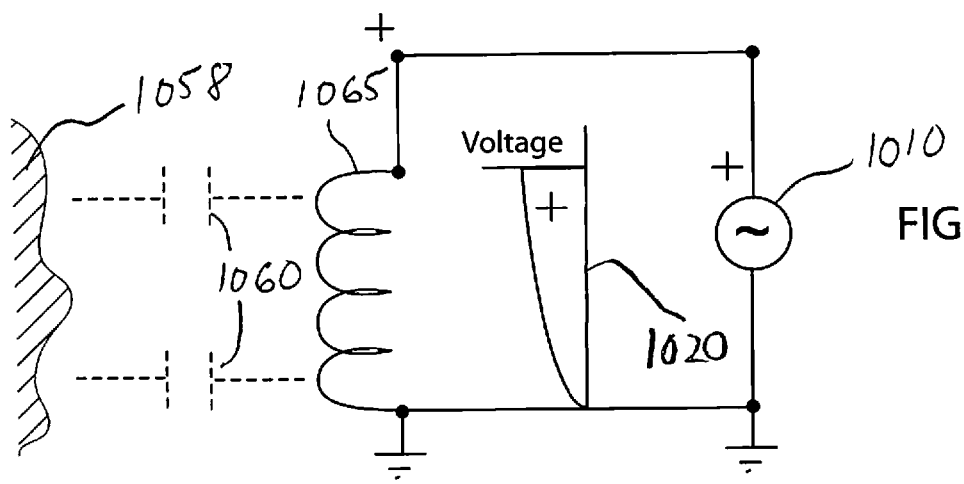
FIG. 10 is a simplified diagram of a matching network configured to power the coil of an inductive applicator module using balanced phase and antiphase voltages.

Another aspect of the present invention is to mitigate and/or eliminate capacitively coupled voltage from a conductor or coil of an ICE to the inductive plasma. When a plasma is maintained in the chamber, there can be a space charge plasma sheath between the relatively conductive region of a plasma (i.e. such as a region represented by volume 585 in the simplified drawing shown in FIG. 5) and the inside wall of the chamber. With respect to FIG. 10A, when the coil 1065 of an ICE is powered in a single ended mode such as when exemplary RF voltage source 1010 applies momentarily positive voltage distribution 1020 on coil 1065, the positive RF voltage on the coil can induce a net positive capacitive current from the coil to conductive regions 1158 of the plasma through parasitic capacitances 1060. Conversely, when the coil is momentarily negative, there can be a negative capacitive current flow from the coil to the plasma. Generally such currents are undesirable because they tend to increase the plasma potential and can intensify ion bombardment of chambers walls and other surfaces that are exposed to the plasma. Ion bombardment of chamber walls can cause wall erosion and contamination in a process.

Figure 10B:
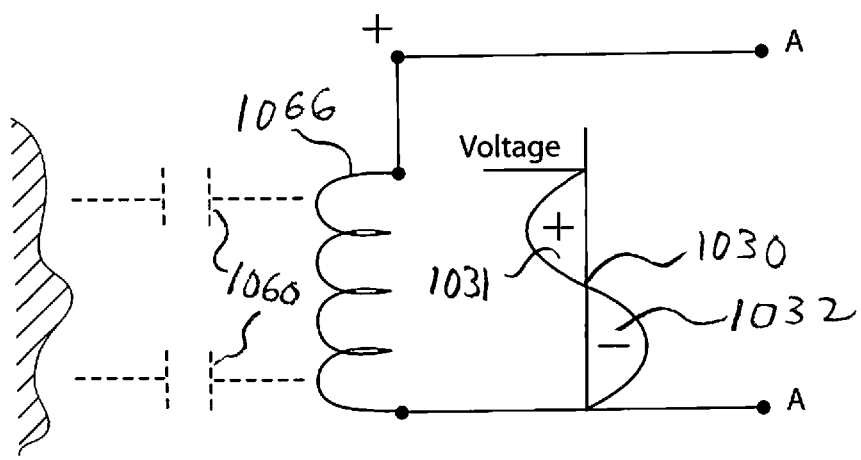

In various aspects with respect to FIG. 10B, the terminals A-A of an ICE coil are powered using symmetrical phase and antiphase voltage 1030 that is balanced with respect to ground potential. The balanced voltage applied to the coil terminal is operable to produce a balanced symmetrical voltage distribution 1030 along the coil. Since the extents of momentary positive 1031 and negative 1032 voltages along the coil are approximately equal, relative amounts of momentary positive and negative capacitive currents to the plasma through parasitic capacitances 1060 is cancelled. In these aspects there is substantially no net capacitive current flow between the coil and the plasma. Hence ion bombardment associated with capacitive current can be mitigated and/or avoided in various embodiments.

Figure 10C:
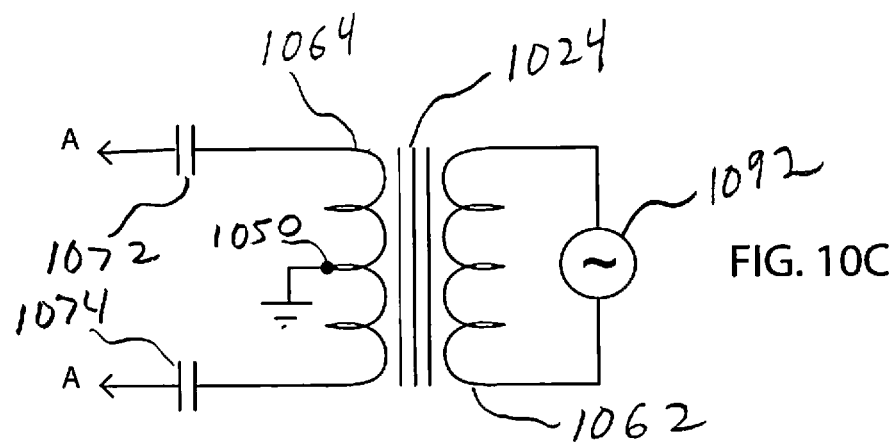

In some embodiments with respect to FIG. 10B, a true push-pull drive is applied to ends A-A of an ICE coil. The true push-pull drive can be obtained using an output from balanced resonant-matching network such as obtained at ends A-A with respect to FIG. 10C. The circuit in FIG. 10C comprises a balun transformer 1024 having primary winding 1062 connected to an RF power source 1092 and secondary winding 1064 connected by way of two equal capacitors 1072 and 1074 to ICE coil 1066 in FIG. 10B. Also, tap 1050 is connected to ground potential. Capacitors 1072 and 1074 form a resonant circuit with ICE coil 1066 having resonance close to the frequency of the RF power source. The ratio of turns of the primary and secondary windings of transformer 1024 can be selected to match the coil, coupled with an associated flux concentrator and plasma load, to the output impedance of the RF power source.

It can be seen that push-pull (symmetrical or balanced) drive of an ICE coil with phase and antiphase voltages applied to respective coil ends, provides equal magnitude but opposite phase capacitive current to the window near the coil ends. In various embodiments the dielectric constant of the window material is relatively large ($k \gg 1$). At radio frequency, the window can perform as a low impedance medium (somewhat analogous to the effect of a metallic shield at low frequency) that can short circuit an electrical field between positive and negative ends of an ICE conductor. It can be seen that the window medium is operable to effectively cancel a portion of the opposing capacitive currents from positive and negative portions of the coil. However various embodiments powered with a symmetrical voltage and/or a push-pull drive are not limited by the dielectric constant of the window and/or short circuiting an electrical field between positive and negative portions of an ICE conductor.

In the foregoing specification, various aspects are described with reference to specific embodiments, but those skilled in the art will recognize that further aspects are not limited thereto. Various features and aspects-described above may be used individually or jointly. Other aspects of the invention, including alternatives, modifications, permutations and equivalents of the embodiments described herein, will be apparent to those skilled in the art from consideration of the specification, study of the drawings, and practice of the various aspects. Further, various aspects can be utilized in any number of environments and applications beyond those described herein without departing from the broader spirit and scope of the description. The written description and accompanying drawings are, accordingly, to be regarded as illustrative rather than restrictive.

The embodiments and preferred features described above should be considered exemplary, with the invention being defined by the appended claims, which therefore include all such alternatives, modifications, permutations and equivalents as fall within the true spirit and scope of the present disclosures.

What is claimed is:

1. A method of processing a semiconductor wafer using an inductive plasma, the method comprising:

placing a semiconductor wafer on a semiconductor wafer holder in the interior of a process chamber; the process chamber comprising a plurality of dielectric windows on a surface of the processing chamber, each of the dielectric windows having a thickness of less than approximately five millimeters, the width of each of the dielectric windows being substantially smaller than the span of the chamber;

admitting a process gas into the interior of the process chamber;

maintaining a preselected pressure below 100 Torr in the process chamber;

energizing an inductive plasma applicator external to the process chamber to generate a substantially inductive plasma in the interior of the process chamber; the inductive plasma applicator comprising a plurality of inductive coupling elements, each of the plurality of inductive coupling elements being associated with one of the plurality of dielectric windows, each of the plurality of inductive elements comprising a flat coil portion and a magnetic flux concentrator of a ferromagnetic material, the magnetic flux concentrator having an inverted U-shape cross section having an open side and two legs, the open side of the U-shaped magnetic flux concentrator positioned over the entire lateral width of the flat coil portion such that the open side of the magnetic flux concentrator faces the dielectric window associated with the inductive coupling element and such that each leg of the magnetic flux concentrator is within approximately five millimeters or less of the process chamber interior, and performing at least one treatment of the semiconductor wafer using the substantially inductive plasma;

wherein the magnetic flux concentrator is operable to focus magnetic flux into the process chamber interior in a localized region proximate the dielectric window associated with the inductive coupling element such that a majority of the magnetic flux within the chamber from an inductive coupling element is localized in a volume between the dielectric window and the substrate and bounded by the lateral width of the associated flux concentrator.

2. The method of claim 1, wherein the magnetic flux concentrator comprises a ferromagnetic material having a magnetic permeability relative to vacuum of at least 10.

3. The method of claim 1, wherein admitting a process gas into the interior of the process chamber comprises admitting process gas through a plurality of feed holes interspersed among the plurality of inductive coupling elements.

4. The method of claim 3, wherein admitting process gas through a plurality of feed gas holes comprises independently controlling the flow of feed gas from the plurality of feed gas holes.

5. The method of claim 3, wherein admitting process gas through a plurality of feed gas holes comprises delivering a process gas through a first feed gas hole of the plurality of feed gas holes at a first flow rate and delivering a process gas through a second feed gas hole of the plurality of feed gas holes at a second flow rate.

6. The method of claim 1, wherein the method comprises selectively energizing different inductive coupling elements.

7. The method of claim 1, wherein the inductive coupling elements are operable to emit magnetic flux from one of the legs of the magnetic flux concentrator in a generally downward direction through the dielectric window associated with the inductive element into the interior of the process chamber and returning to another leg of the magnetic flux concentrator from the interior of the process chamber.

8. The method of claim 1, wherein at least about 80% of the magnetic flux emitted from the inductive coupling element is within about five centimeters of the inductive coupling element.

9. The method of claim 1, wherein a plasma current is induced by the magnetic flux within the localized region adjacent to the dielectric window associated with the inductive coupling element.

10. The method of claim 1, wherein the plurality of inductive coupling elements are positioned such that there is an inductive coupling element within approximately five inches of each portion of the semiconductor wafer.

11. The method of claim 1, wherein the plurality of inductive coupling elements are positioned such that there is an inductive coupling element within approximately two inches of each portion of the semiconductor wafer.

* * * * *